(12) United States Patent
Kridner

(10) Patent No.: US 7,546,636 B1
(45) Date of Patent: Jun. 9, 2009

(54) AUTHORIZATION CONTROL CIRCUIT AND METHOD

(75) Inventor: Jason D. Kridner, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1311 days.

(21) Appl. No.: 09/712,873

(22) Filed: Nov. 15, 2000

Related U.S. Application Data

(60) Provisional application No. 60/171,048, filed on Dec. 16, 1999.

(51) Int. Cl.
*G06F 21/00* (2006.01)
(52) U.S. Cl. ......................................... 726/17
(58) Field of Classification Search .................. 713/200; 712/35; 710/69; 455/194.1; 726/17
See application file for complete search history.

(56) References Cited

U.S. PATENT DOCUMENTS

| | | | | |
|---|---|---|---|---|
| 5,063,597 A | * | 11/1991 | Seo et al. | 704/226 |
| 5,612,682 A | * | 3/1997 | DeLuca et al. | 340/5.74 |
| 5,734,729 A | * | 3/1998 | Tran | 381/94.5 |
| 6,052,600 A | * | 4/2000 | Fette et al. | 455/509 |
| 6,114,981 A | * | 9/2000 | Nagata | 341/143 |
| 6,170,060 B1 | * | 1/2001 | Mott et al. | 726/29 |
| 6,675,002 B1 | * | 1/2004 | Lipovski | 455/194.1 |
| 2002/0077177 A1 | * | 6/2002 | Elliott | 463/40 |

OTHER PUBLICATIONS

Wolfson Microelectronics LTD, *WM8725 99dB Stereo DAC*, Production Data Datasheet (1998).
Phillips Semiconductor, *TDA8559 Low-Voltage Stereo Headphone Amplifier*, Production Specification (1997).
Burr-Brown Corp., *PCM 3002 PCM 3003 16-/10-bit Single-Ended Analog Input/Output Sound Plus Stereo Audio CODECS*, Product Specification (1997).
Thompson Consumer Electronics, Inc., *Lyra*, User's Guide (1998).

* cited by examiner

*Primary Examiner*—Andrew L Nalven
(74) *Attorney, Agent, or Firm*—Robert D. Marshall, Jr.; Wade J. Brady, III; Frederick J. Telecky, Jr.

(57) ABSTRACT

An authorization control circuit (10) comprises a digital signal processor (12) operable to provide digital data output, determine an authorization state, and generate a disable signal. A digital to analog converter (28,60) is coupled to the digital signal processor (12) and is operable to receive the digital data output. The digital to analog converter (28,60) generates analog data in response to the digital data output and is operable to output the analog data and mute the output of analog data. The digital to analog converter (28,60) includes an input (23,25,27,59) operable to receive the disable signal. The digital to analog converter (28,60) mutes the output of analog data in response to the disable signal.

15 Claims, 1 Drawing Sheet

AUTHORIZATION CONTROL CIRCUIT AND METHOD

This application claims priority under 35 USC §119(e)(1) of Provisional Application No. 60/171,048, filed Dec. 16, 1999.

TECHNICAL FIELD OF THE INVENTION

This invention relates generally to the field of electronic devices, and more particularly to an authorization control circuit and method.

BACKGROUND OF THE INVENTION

Electronic devices may need to control or disable various outputs in accordance with authorization information. Digital devices typically manipulate their own digital data output to a device that provides analog output to control or disable that analog output. Manipulating the digital data to disable the analog output can result in unwanted output artifacts. It also continues to require power for the conversion of digital data and the output of analog data. In addition, if the device receives power from a battery, that unnecessary power usage can shorten battery life.

SUMMARY OF THE INVENTION

Accordingly, a need has arisen in the art for an improved authorization control circuit. The present invention provides an authorization control circuit and method that substantially reduce or eliminate problems associated with prior authorization control systems.

In accordance with the present invention, an authorization control circuit comprises a digital signal processor operable to provide digital data output, determine an authorization state, and generate a disable signal. A digital to analog converter is coupled to the digital signal processor and is operable to receive the digital data output. The digital to analog converter generates analog data in response to the digital data output and is operable to output the analog data and mute the output of analog data. The digital to analog converter includes an input operable to receive the disable signal. The digital to analog converter mutes the output of analog data in response to the disable signal.

More specifically, in accordance with one embodiment of the present invention, the authorization state is determined as either positive or negative. The digital signal processor is operable to generate the disable signal in response to a negative authorization state.

More specifically, in accordance with one embodiment of the present invention, the authorization state is determined as either positive or negative. The digital signal processor is operable to generate the disable signal in response to a negative authorization state. The digital signal processor is operable to detect the disable signal and generate an override signal. The digital to analog converter is operable to cease muting the output of analog data in response to the override signal.

Technical advantages of the present invention include providing a authorization control circuit. In particular, the authorization control circuit may disable output from a digital source. Accordingly, power required to amplify the output is reduced. As a result, battery life may be increased. Another technical advantage is that output can be disabled without undesirable artifacts.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

Figure 1:
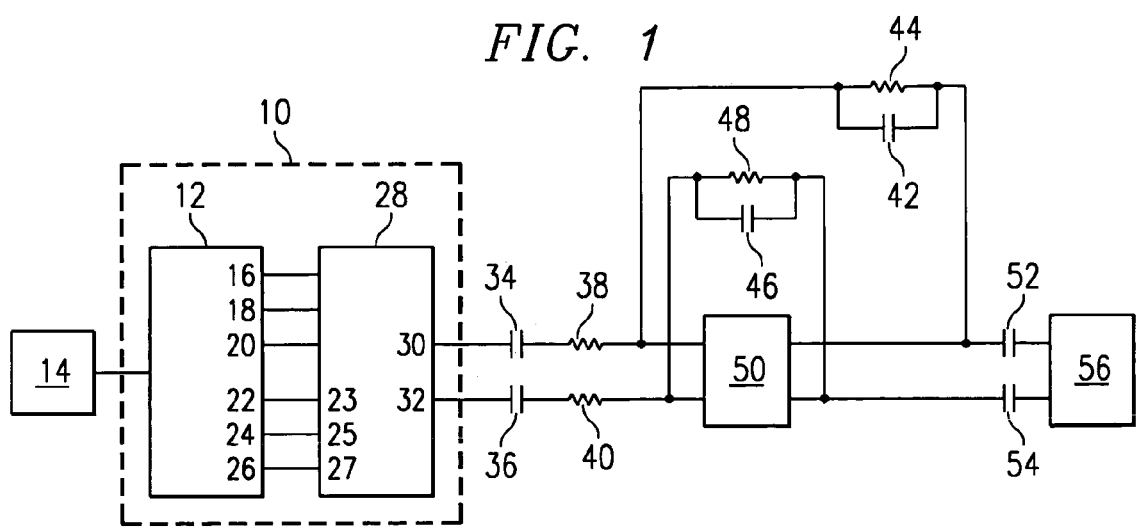
FIG. 1 is a block diagram illustrating a system for playing digitally stored audio files in accordance with one embodiment of the present invention.

The preferred embodiments of the present invention and its advantages are best understood by referring now in more detail to the figures in which like numerals refer to like parts. FIG. 1 illustrates a system for playing digitally stored audio files in accordance with one embodiment of the present invention. As described in more detail below, the system may include software for determining an authorization state. A disable signal may be generated if the authorization state is negative. A disable signal may also be generated when a sleep definition is met. An input in the signal processing circuits may control a muting function operable to receive the disable signal. Accordingly, unauthorized output can be prevented and power use can be reduced.

FIG. 1 is a block diagram illustrating a system for playing digitally stored audio files including an authorization control circuit 10 for communicating data in an electronic device. The electronic device may also comprise a music, video, or multimedia file player or any other type of device that displays data to be heard or seen by the user.

Referring to FIG. 1, the authorization control circuit 10 comprises a data storage 14 and a digital signal processor 12. In one embodiment, the digital signal processor can be a fixed-point digital signal processor made by Texas Instruments. In another embodiment, the digital signal processor could be a general purpose processor. Data files received from the storage 14 are processed in the digital signal processor 12.

In one embodiment, a file selected by the user to be played is first hashed by the digital signal processor 12. Hashing is running the file through a mathematical algorithm that yields a fixed-length value or key that represents the original file. The mathematical algorithm is the hashing function. A hashing function is secure if it is computationally infeasible to find a file that corresponds to a given value or key, or to find two different files which produce the same value or key. For example, the Secure Hashing Algorithm (SHA-1) was made available by the National Institute of Standards and Technology on Apr. 17, 1995. By transforming a file with a secure hashing function and checking the key for the authorized file, the digital signal processor 12 can determine if the file has been changed (for example, illegally copied). An authorization state is determined by the comparison of the hashing result and the expected key. If they match, the authorization state is positive. If they do not, it is negative.

The digital signal processor 12, in one embodiment, can be programmed with a sleep function. The sleep function would monitor usage of the device and generate a sleep signal if usage meets predetermined criteria. For example, the criteria could be unchanged, repeat play of a file for a certain period. In one embodiment, the sleep function could also allow for user customization of the time period criterion.

The digital signal processor 12 includes a digital data output 16, a bit clock output 18, and a channel output 20. Each output is connected to an input of a digital audio converter (DAC) 28. In one embodiment, the DAC 28 is a Codec. The DAC 28 reads digital data by sampling the digital data output 16 in accordance with the clock signal received from the bit clock output 18. If the DAC is operable to produce stereo output, it classifies the digital data as corresponding to the left or right analog channel by the state of the channel output 20 when the digital data is received.

Figure 4:
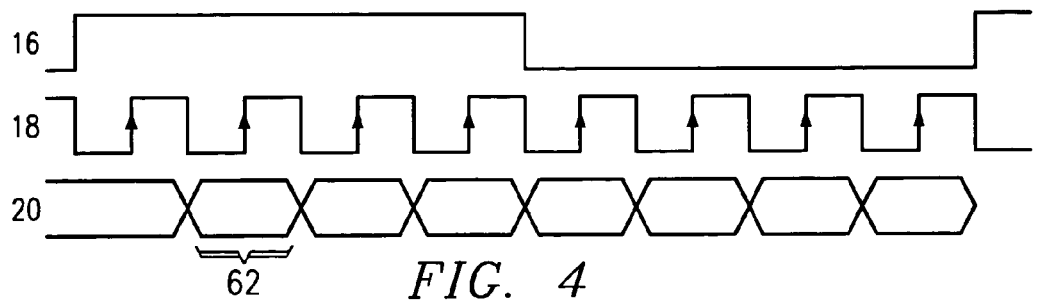
FIG. 4 is a signal diagram illustrating the input format of digital data in accordance with one embodiment of the present invention.

FIG. 4 illustrates a signal diagram of outputs 16,18,20. In one embodiment, digital bit 62 is read at the rising edge of bit clock output 18. The bit 62 corresponds to the analog channel indicated by the high state of channel output 20. The DAC receives a series of bits in one channel and then a series of bits in the other. In another embodiment, each bit could correspond to a different channel than the previous bit if the channel output 20 changed between each bit.

Referring to FIG. 1, the DAC 28 converts the digital data to two channels of analog data 30,32. The analog data is transmitted to an amplifier 50 through coupling capacitors 34,36. The amplification of the first channel 30 is determined by the resistors 38,44. The amplification of the second channel 32 is determined by resistors 40, 48. Capacitors 42,46 can be included in parallel with the bypass resistors 44,48.

The two channels of amplified analog data are transmitted to output 56 via coupling capacitors 52,54. In one embodiment the output 56 is a pair of headphone speakers. The output could also be larger speakers or a video display, among other devices.

The digital signal processor also includes outputs separate from the data outputs 16,18,20 that control the muting function of the DAC 28. Those outputs are the mode word output 22, the mode bit output 24, and the mode data output 26. The DAC receives those outputs at mode inputs 23,25,27 which are operable to receive a mute signal.

Figure 5:
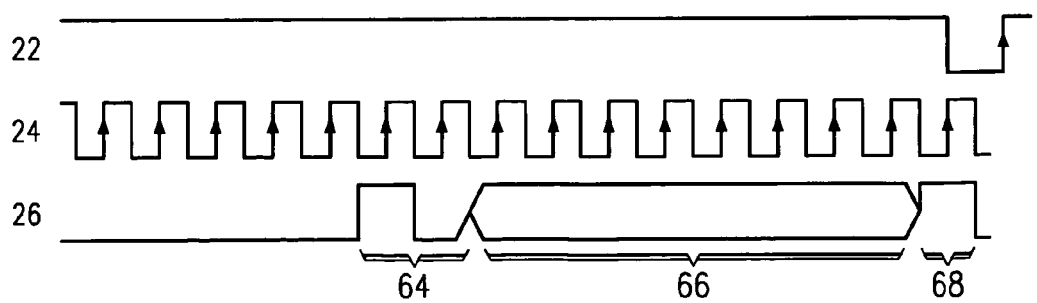
FIG. 5 is a signal diagram illustrating the input format of control signals in accordance with one embodiment of the present invention.

FIG. 5 illustrates a signal diagram of outputs 22,24,26. The mode word output 22 toggles to indicate the border between words (a sequence of a predetermined number of bits). The mode bit output 24 toggles to indicates the location of bits in the mode data 26. The mode data 26 includes address bits 64 that indicate which mode address is being modified by the word. The mode data 26 also includes function bits 66 and mute bit 68. The mute bit 68 is a signal that, when properly indicated by mode word and mode bit outputs 22,24, disables the analog output by activating the DAC mute. The DAC mute can operate through a digital filter in the DAC which processes the digital data before it is converted into analog data. A pull-down circuit in the DAC coupled to mode data input 27 creates a low voltage at the input if the disable signal is absent.

The disable signal can be sent in response to a negative authorization state, a sleep signal, or other signals produced by the digital signal processor 12. For example, override software, placed on the digital signal processor 12 for testing or other reasons, can block the disable signal even though a negative authorization state has resulting from a hashing function-key comparison.

Figure 2:
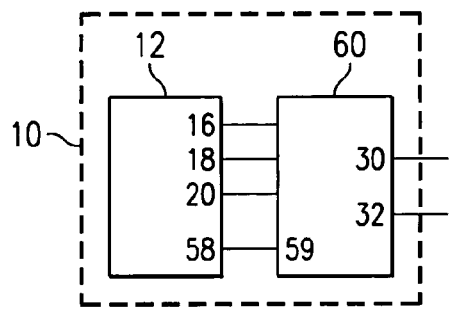
FIG. 2 is a block diagram illustrating one embodiment of the present invention.

FIG. 2 is a block diagram illustrating an embodiment of the present invention. In that embodiment, a DAC 60 with a single mute input 59 is included in authorization circuit 10. An output 58 on the digital signal processor 12 controls the mute function of the DAC 60 with a high or low signal. The DAC 60 receives digital data from outputs 16,18,20 and transmits analog data on two channels 30,32 as described with reference to FIG. 1.

Figure 3:
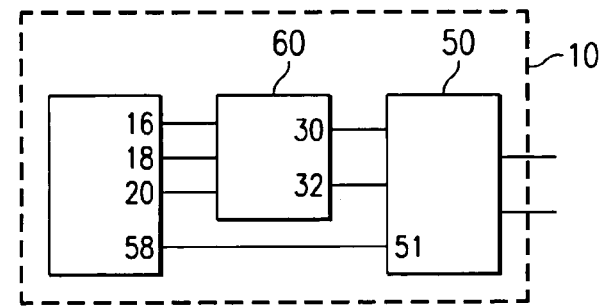
FIG. 3 is a block diagram illustrating one embodiment of the present invention.

FIG. 3 is a block diagram illustrating an embodiment of the present invention. In that embodiment, the single mute output 58 of the digital signal processor 12 is connected to an input 51 of amplifier 50 and controls the mute function of the amplifier 50 in response to an authorization state or sleep signal as discussed in reference to FIG. 1. DAC 60 receives digital data from outputs 16,18,20 and transmits analog data on two channels 30,32 as described with reference to FIG. 1. Amplifier 50 amplifies the analog data unless the mute function is selected by the disable signal in which case the analog data is muted.

Although the present invention has been described with several embodiments, various changes and modifications may be suggested to one skilled in the art. It is intended that the present invention encompass such changes and modifications as fall within the scope of the appended claims.

What is claimed is:

1. An electronic device including an authorization control circuit, comprising:

a data storage including one or more data files, wherein each of the data files is a digital audio file, video file, or multimedia file;

a digital signal processor operably coupled to the data storage, said digital signal processor operable (A) to provide digital data output, (B) to determine an authorization state by (a) receiving a data file selected by a user from the one or more data files, (b) hashing the data file to generate a fixed-length value or key representing the data file, and (c) comparing the fixed-length value or key to an expected fixed-length value or key for the data file, wherein the comparison determines if the data file has been changed or is an invalid copy, and (C) to generate a disable signal corresponding to the authorization state, wherein the disable signal is also capable of being generated when the electronic device satisfies one or more sleep conditions;

a digital to analog converter operably coupled to the digital signal processor and operable to receive the digital data output, convert the digital data to corresponding analog data, and output the analog data;

the digital to analog converter including a mode input pin operable to receive the disable signal from the digital signal processor, and the digital to analog converter operable to mute output of the analog data without adding noise artifacts in response to the disable signal;

wherein the digital signal processor has at least three output pins comprising a clock output pin to provide a clock signal, a mode output pin to provide the disable signal, and a digital data output pin to provide the digital data for conversion into analog data;

wherein the digital to analog converter further comprises a digital data input pin to receive the digital data for conversion, and a serial input pin to receive the clock signal to enable reception of the disable signal; and wherein the digital to analog converter reads the state of the disable signal at the rising edges of the clock signal.

2. The electronic device of claim 1, wherein the authorization state is either positive or negative and the digital signal processor is operable to generate the disable signal when the authorization state is negative.

3. The method of claim 2, wherein the operation of reading the state of the disable signal at the digital to analog converter at rising edges of the clock signal comprises:
   reading mode data from the digital signal processor at the mode input pin of the digital to analog converter, wherein the mode data comprises address bits, function bits, and a disable bit; and
   at the digital to analog converter, reading the disable bit within the mode data as the disable signal.

4. The electronic device of claim 1, wherein the digital to analog converter mutes the analog output by filtering the received digital data prior to converting the received digital data into analog data.

5. The electronic device of claim 1, wherein the digital signal processor is operable to transmit the disable signal as a high voltage on the mode output pin.

6. The electronic device of claim 1, the digital to analog converter further comprising:
   a pull-down circuit operable to create a low voltage at the input pin in the absence of a disable signal.

7. The circuit of claim 1, wherein one of the sleep conditions is usage of the electronic device, said disable signal generated when the usage meets a predetermined criteria.

8. The circuit of claim 1, wherein the electronic device is a music player, video player, or multimedia file player.

9. The electronic device of claim 1, wherein:
   the electronic device further comprises a first signal line connecting the mode output pin of the digital signal processor directly to the mode input pin of the digital to analog converter, and a second signal line connecting the digital data output pin from the digital signal processor to the digital data input pin of the digital to analog converter;
   the digital signal processor is operable to transmit mode data on the mode output pin, wherein the mode data comprises address bits, function bits, and a disable bit; and
   the digital to analog converter is operable to read the disable bit within the mode data as the disable signal.

10. A method of selectively muting output in an electronic device, comprising the steps of:
    generating digital data;
    determining an authorization state, wherein determining the authorization state comprises:
      retrieving a data file from one or more data files in a data storage device, wherein the data file is a digital audio file, video file, or multimedia file, said data file including the digital data, and wherein the retrieval is executed by a digital signal processor of the electronic device;
      performing a hashing function on the data file to generate a fixed-length value or key representing the data file, wherein the hashing function is executed by the digital signal processor; and
      comparing the fixed-length value or key to an expected fixed-length value or key for the data file, wherein the comparison is executed by the digital signal processor to determine if the data file has been changed or is an invalid copy;
    automatically generating a disable signal corresponding to the authorization state in response to a determination that the data file has been changed or is an invalid copy, wherein the disable signal is generated by the digital signal processor and the digital signal processor is also operable to generate the disable signal when the electronic device satisfies one or more sleep conditions;
    transmitting the digital data from the digital signal processor to a digital data input pin of a digital to analog converter;
    generating, at the digital to analog converter, an analog signal corresponding to the digital data, and outputting the analog signal;
    in response to a negative authorization state, automatically transmitting the disable signal from a mode output pin of the digital signal processor to a mode input pin of the digital to analog converter;
    muting, at the digital to analog converter, the analog signal without adding noise artifacts in response to receiving the disable signal at the digital to analog converter
    receiving a clock signal from the digital signal processor at a serial input pin of the digital to analog converter; and
    reading the state of the disable signal at the digital to analog converter at rising edges of the clock signal.

11. The method of claim 10, wherein the step of muting comprises activating a digital filter in the digital to analog converter.

12. The method of claim 10, wherein the clock signal is transmitted to the digital to analog converter contemporaneously with the disable signal.

13. The method of claim 10, further comprising the step of:
    generating a power-save signal and wherein the disable signal is generated in response to the power-save signal.

14. The method of claim 10, further comprising the steps of:
    generating an override signal; and
    terminating the muting step in response to the override signal.

15. The method of claim 14, further comprising the step of:
    detecting the step of generating the disable signal; and
    wherein the override signal is generated in response to the detection of the disable signal.

* * * * *